United States Patent [19]
Niitsu et al.

[11] Patent Number: 5,735,696
[45] Date of Patent: Apr. 7, 1998

[54] RIGHT-ANGLE BOARD TO BOARD CONNECTOR WITH ANTI-WICKING CHARACTERISTICS AND TERMINAL FOR SAME

[75] Inventors: Toshihiro Niitsu; Minoru Fukushima, both of Yokohama, Japan

[73] Assignee: Molex Incorporated, Lisle, Ill.

[21] Appl. No.: 649,892

[22] Filed: May 14, 1996

[30] Foreign Application Priority Data

Nov. 16, 1995 [JP] Japan .................. 7-013060 U

[51] Int. Cl.⁶ .................................................. H01R 9/09
[52] U.S. Cl. ................................................ 439/65; 439/83
[58] Field of Search ............................... 439/62, 79, 80, 439/83, 660, 876, 495, 496, 65

[56] References Cited

U.S. PATENT DOCUMENTS

| | | | |
|---|---|---|---|
| 4,439,000 | 3/1984 | Kaufman et al. | 439/62 |
| 4,917,614 | 4/1990 | Kikuchi et al. | 439/83 |
| 5,127,839 | 7/1992 | Korsunsky et al. | 439/79 |
| 5,152,694 | 10/1992 | Bargain | 439/66 |
| 5,201,663 | 4/1993 | Kikuchi et al. | 439/83 |
| 5,320,541 | 6/1994 | Korsunsky et al. | 439/79 |
| 5,393,234 | 2/1995 | Yamada et al. | 439/62 |
| 5,451,172 | 9/1995 | Lee Siew Suan et al. | 439/495 |
| 5,453,017 | 9/1995 | Belopolsky | 439/83 |

FOREIGN PATENT DOCUMENTS

| | | |
|---|---|---|
| 5-326084 | 12/1993 | Japan . |
| 6-13145 | 1/1994 | Japan . |
| 6-54273 | 7/1994 | Japan . |
| 7-201424 | 8/1995 | Japan . |
| 7-240246 | 9/1995 | Japan . |

*Primary Examiner*—Neil Abrams
*Attorney, Agent, or Firm*—Charles S. Cohen

[57] ABSTRACT

A connector which is particularly suitable for angled, surface mount connections has improved anti-solder and/or flux wicking characteristics which substantially prevent the contamination of contact portions of the connector terminals. Terminals for the connector are provided which have a housing engagement portion at one end and a bifurcated portion at the other end. The bifurcated end portion includes a contact portion and a solder tail portion which are separated by an irregular intervening space of varying width. The depth and the varying width cooperate to prevent the wicking of molten solder and/or flux to the contact surface of the terminal.

23 Claims, 3 Drawing Sheets

RIGHT-ANGLE BOARD TO BOARD CONNECTOR WITH ANTI-WICKING CHARACTERISTICS AND TERMINAL FOR SAME

BACKGROUND OF THE INVENTION

The present invention generally relates to surface mount connectors used for mounting on printed circuit boards and, more particularly, to an improved board-to-board connector with improved anti-wicking characteristics that prevents the wicking of solder and/or solder flux into the connector during the process of mounting the connector onto a circuit board.

Conventional surface mount connectors are used to interconnect two printed circuit boards and typically include two connector components, each connector component having an insulative housing and a plurality of conductive terminals arranged within the housing in a predetermined spacing. Each of the connector terminals has a base which extends through the housing, near the mounting surface thereof, and further projects out of the housing to form a solder tail. In mounting such connectors to a surface of a printed circuit board, each solder tail is fixed on a conductive circuit trace printed on a circuit board by soldering it to the circuit trace. This soldering is typically accomplished by aligning the connector solder tails with the circuit board traces upon which a combination of solder paste and flux have been deposited, then passing the aligned assembly through an appropriate heating means, such as an infrared oven, to melt the solder and flux to thereby form a connection between the connector solder tails and the circuitry of the circuit board.

In these conventional connectors, molten solder and/or solder flux has a tendency to flow or "wick" up along the solder tails of the terminals. As a result of this wicking, the contact portions of the terminals may become contaminated by the solder and/or flux. This contamination decreases the performance of the connector.

Some connectors are known which, at first glance, appear to have desirable anti-wicking characteristics by providing a cavity, or intervening space, between the contact and solder tail portions of its terminals, such as that described in Japanese Utility Model Publication No. 6-54273. This depicts a connector assembly having two connector components engaging each other at a right angle to each other while holding a circuit board in a horizontal plane by compressively contacting the circuit board between the two connector components. The printed circuit board mounted component of this connector assembly depicts a connector terminal having a bifurcated end in which contact and solder tail portions are separated by a narrow intervening space. Although the contact and solder tail portions of this connector are bifurcated, they are spaced symmetrically and evenly apart along their longitudinal extent. Additionally, the contact surface of this terminal is located on an interior surface of the bifurcated end of the terminal.

The present invention is therefore directed to a surface mount connector which overcomes the aforementioned disadvantages and which has improved anti-wicking capabilities and which further represents an improvement over the structure described in the aforesaid Japanese Utility Model Publication and other similar connectors. Moreover, the present invention is particularly suited for mounting one circuit board at an angle to another circuit board.

SUMMARY OF THE INVENTION

In one principal aspect of the present invention, an electrical connector is provided with an insulative housing. The housing contains two sets of conductive terminals arranged at predetermined spacings within the housing on opposite side of a connector component-receiving slot. Each of the terminals of one of the two terminal sets is bifurcated at one end. That is, it has spaced apart solder tail and contact portions. The solder tail portion of the bifurcated end extends out of the connector through the housing, while the contact portion thereof extends within the housing, generally in the same direction as the solder tail portion. The bifurcated portions of these terminals are separated by an intervening space which extends toward the body of the terminal. The width between the bifurcated contact and solder tail portions varies along the depth of the intervening space so that the space has an irregular nature that inhibits the flow of molten solder and/or solder flux along the solder tail portion onto the terminal contact portion.

Accordingly, it is therefore an object of the present invention to provide a surface mount electrical connector which substantially eliminates wicking of molten solder or solder flux up from a terminal solder tail portion to the terminal contact portion within the housing when soldering the solder tails of the connector onto the printed circuit board.

These and other objects, features and advantages of the present invention will be clearly understood through a consideration of the following detailed description.

BRIEF DESCRIPTION OF THE DRAWINGS

In the course of the following description of the detailed description, reference will be made to the attached drawings wherein like reference numerals identify like parts and wherein.

DETAILED DESCRIPTION OF THE INVENTION

Figure 4:
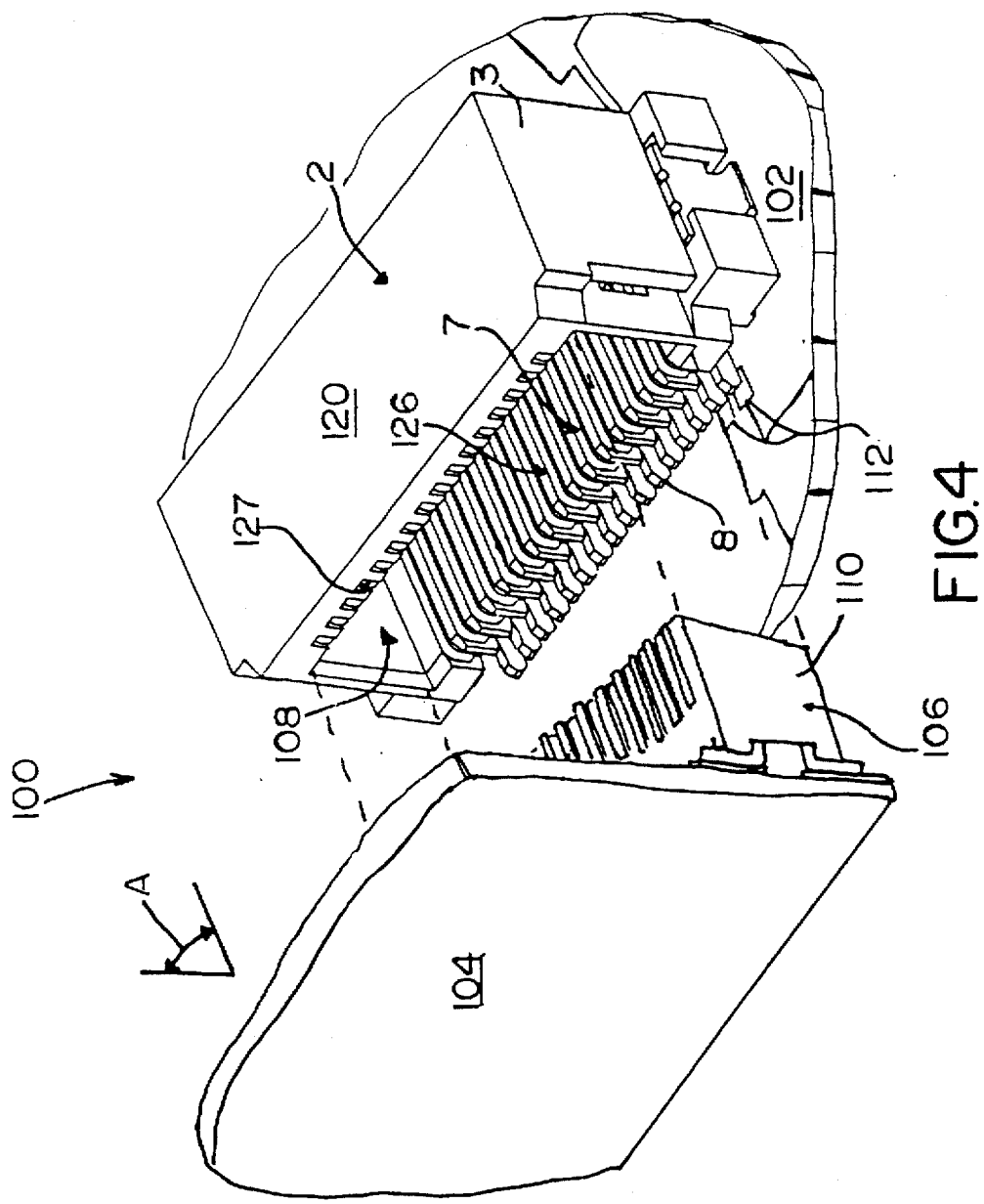

FIG. 4 illustrates a surface mount connector assembly 100 incorporating the principles of the present invention and which is used to interconnect two circuit boards 102, 104. As seen in FIG. 4, the assembly 100 is an angled connector assembly, that is, the two circuit boards 102, 104 are held at an angle to each other (a right angle A being shown) by two connector components 2, 106. The connector components 2, 106 are preferably female or receptacle and male or plug interengaging components, meaning that the female connector component 2 includes a longitudinal slot 108 and the male connector component 106 includes a central plug or projection portion 110, which extends away from its base and is received within the engagement slot 108 of the female connector component 2.

The connector components 2, 106 are affixed to printed circuit boards 102, 104 in the orientation illustrated, by soldering them to circuit traces on the circuit boards. This detailed description will primarily be set forth in terms of the female connector component 2 of the angled surface mount connector assembly 100 illustrated, and it will be understood that the following detailed description is merely exemplary and that the Figures are not to be construed as limiting in nature, but that the present invention may be suitably modified for use with other style connectors.

Figure 3:
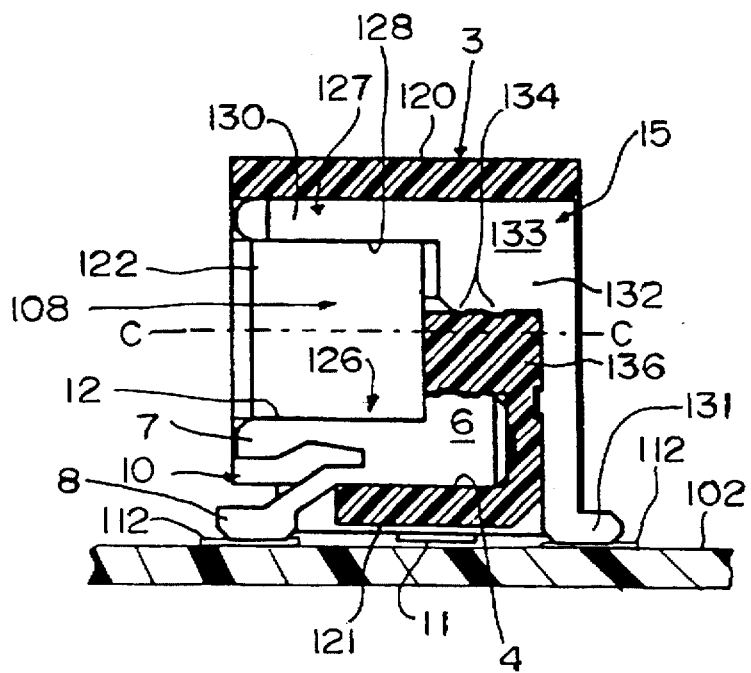
FIG. 3 is a sectional view of the female connector component of FIG. 2 taken along lines 3—3 thereof; and, FIG. 4 is a perspective view of an angled surface mount connector assembly utilizing the female connector component of FIG. 2.
Figure 2:
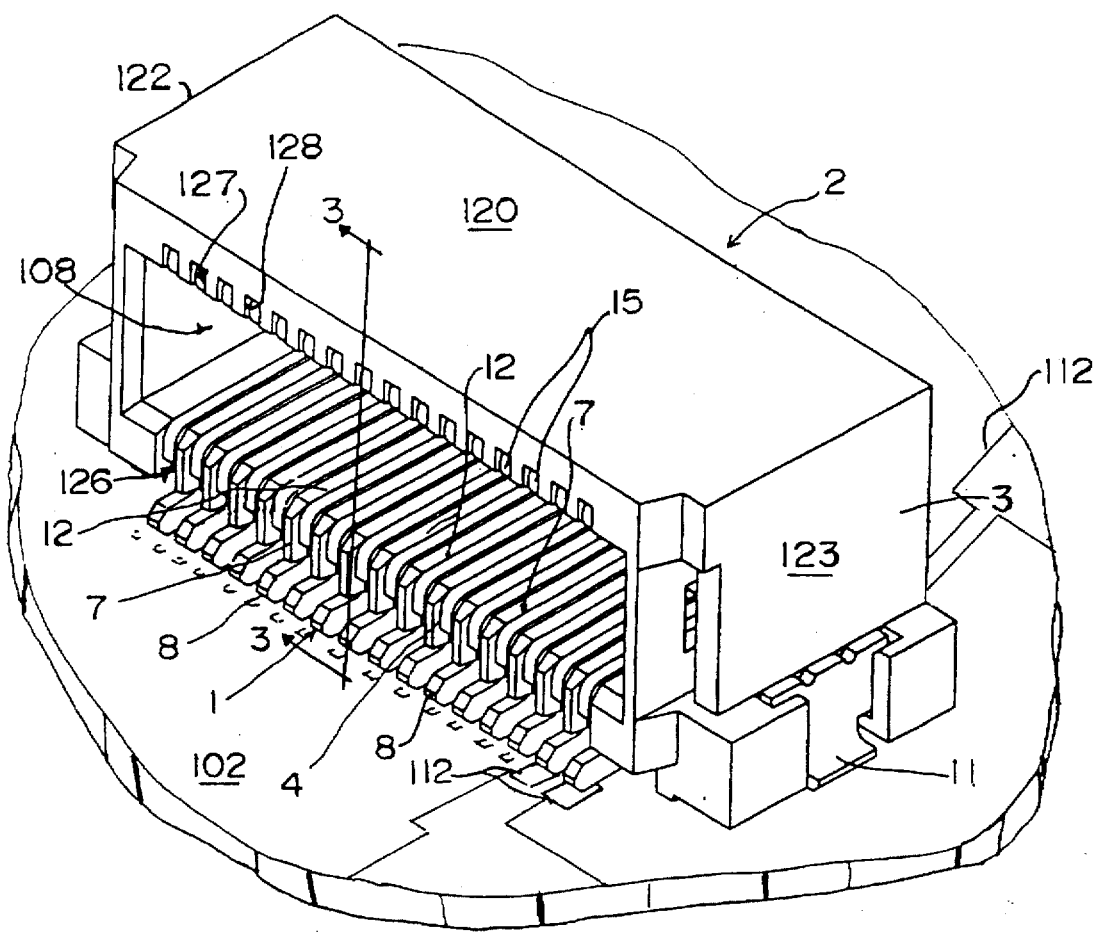
FIG. 2 is a perspective view of a female connector component utilized in the connector assembly of FIG. 4 and utilizing terminals of the type illustrated in FIG. 1.

FIG. 3 illustrates the female connector component 2 of the connector assembly 100 in greater detail. It can be seen that the connector component 2 includes an electrically insulative housing 3 having two opposing sidewalls 120, 121 and two endwalls 122, 123 which cooperatively define an internal male connector component-receiving engagement slot 108 therein. The sidewalls 120, 121 are illustrated as opposing top and bottom walls of the connector housing 3 in order to accommodate the male connector component 106 and its associated secondary circuit board 104 in the angled relationship shown in FIG. 4.

Returning to FIG. 3, it will be noted that the connector engagement slot 108 includes two sets 126, 127 of terminals disposed on opposite sides of a centerline C of the slot 108 (illustrated as the top and bottom inner surfaces of the slot 108). These sets 126, 127 of terminals extend lengthwise within the connector 2 along the sidewalls 120, 121, and as illustrated best in FIG. 3, they are received within respective recesses 128, 4 formed in the sidewalls 120, 121.

One set 127 of the terminals, those shown on top inner surfaces of the connector engagement slot 108, include a plurality of terminals 15 which have an elongated contact portion 130 that extends laterally within the slot 108 and recess 128. The terminals 15 also include a solder tail portion 131 which extends perpendicularly therefrom, shown vertically in FIG. 4. The contact and solder tail portions 130, 131 thereof are joined to a relatively wide terminal body portion 132 which includes a housing engagement head 133, preferably having a plurality of projections or barbs 134 thereon which interferingly contact a center post or rib 136 of the connector housing 3 in order to retain the terminals 127 in place therein. This connector center post 136 may be considered as defining the floor or depth of the connector engagement slot 108 into which the plug portion 110 of the male connector component 106 extends.

Figure 1:
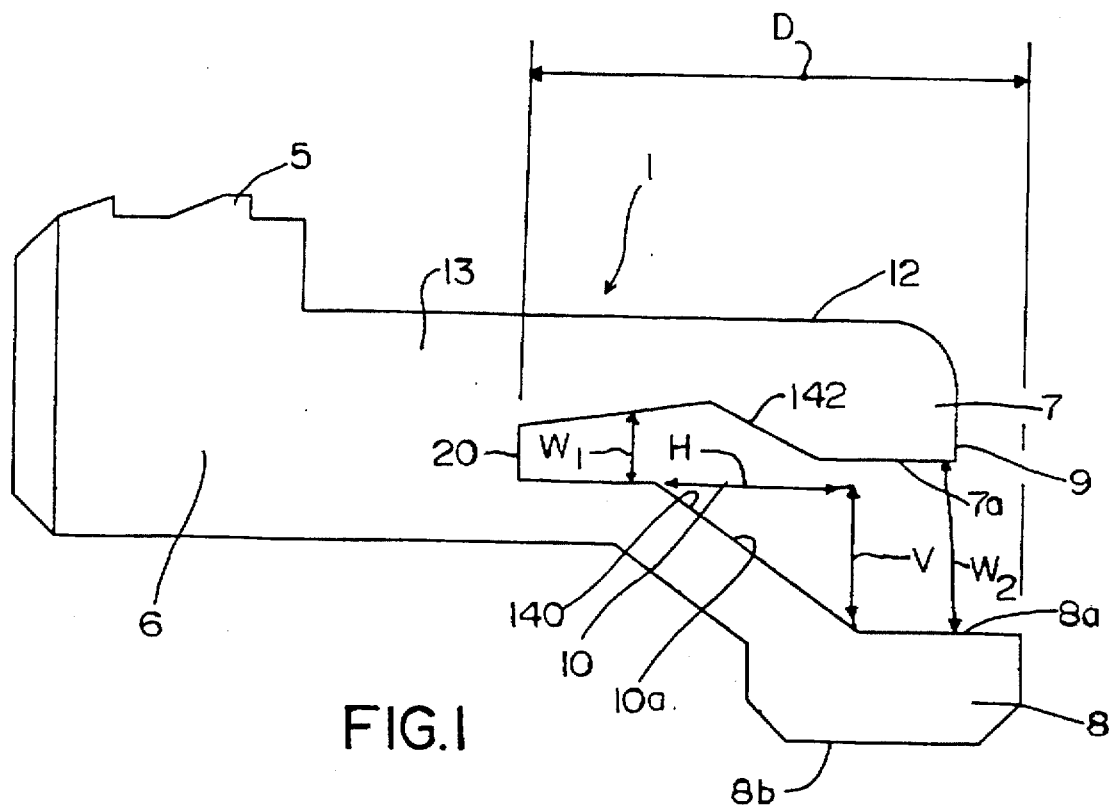
FIG. 1 is a plan view of a terminal constructed in accordance with the principles of the present invention.

A second set 126 of terminals 1 are disposed along the opposing bottom sidewall 121 of the connector housing 3 within a series of spaced-apart recesses 4. As shown in FIG. 1, each such terminal 1 includes a relatively wide terminal body portion 13, having a connector housing engagement head 6 with upstanding projections or barbs 5 thereon which intereferingly engage the connector slot center post 136 in the manner described above on the side opposite first terminal body 132 to retain the terminals 1 in place within the connector 2. A bifurcated portion is found at the other end of the terminal 1 and defines a distinct contact portion 7 and a solder tail portion 8. The contact and solder tail portions 7, 8 are joined to the terminal body portion 13 at a bight portion 20 and are separated by an intervening space 10 which extends relatively deep into the terminal body portion 13, toward the housing engagement head 6 thereof.

In contrast to the top set of terminals 127, the contact and solder tail portions 7, 8 of bottom set 126 of terminals 1 extend in the same general direction away from body portion 13 (shown to the left in FIGS. 3 & 4) and generally parallel to each other. The solder tail portion 8 has two opposing edges: an inner edge 8a and an outer contact edge 8b which rests upon a circuit trace 112 of the circuit board 102. The contact portion 7 also has two opposing edges: an inner edge 7a which confronts the inner edge 8a of the solder tail portion 8, and an exterior contact edge 12 which defines a contact surface for the terminal 1 to engage an opposing contact surface of a terminal of the male connector component 106.

In an important aspect of the present invention, and in contrast to the bifurcated terminals described in Japanese Utility Model Publication No. 6-54273, the contact surfaces 12 and the solder tail solder surfaces 8b are disposed on exterior, opposite edges of the terminal bifurcated portion as compared to a bifurcated terminal with its contact surface disposed on an interior edge of the intervening space.

In another important aspect of the present invention, and as exemplified by the embodiment illustrated, the intervening space 10 is irregular due to the solder tail portion 8 being "stepped," or offset, from the terminal body portion 13 as illustrated, with the offset including a vertical component V and a horizontal component H, the resultant of which defines the slope or angle of an inner edge 10a of an interconnecting, ramped or inclined portion 140 of the terminal 1. The contact portions 7 of the terminals 1 also include ramped portions 142 disposed along their inner edges 7a that generally confront the ramped portions 140 of the solder tail portions 8. These ramped portions increase the surface extent of the interior edges 7a, 8a of the contact and solder tail portions 7, 8 by making them non-linear from the bight 20 to the outer ends thereof as compared to the interior edges of bifurcated end portion using a symmetrical, linear intervening space.

The intervening space 10 separating the contact and solder tail portions 7, 8 is neither symmetrical nor narrow for its entire depth D, as taught by the aforementioned prior art connectors, but rather is irregular in nature and has a width that varies along the depth D of the intervening space 10. One such variance is demonstrated in FIG. 1 by the disparate lengths of the two width indicators $W_1$ and $W_2$.

The terminals 1 of the connector component 2 may be formed by an appropriate process, such as stamping or blanking them from a sheet of conductive metal and subsequently plating the stamped terminal with gold or similar conductivity-enhancing metal. In other words, the width of the terminals is defined by the thickness of the material from which the terminals are stamped. After stamping and plating the terminals 1, they are press-fit into the connector housing 3 until the housing engagement heads 6 thereof firmly engage the connector slot center post 136.

When mounting such a connector on a circuit board, a mixture of solder paste and flux is first applied to circuit pads 112 on the circuit board 102. The connector component 2 is then mounted on the circuit board 102 so that the solder tails 8, 131 of the connector component 2 are aligned with the circuit traces 112 of the circuit board 102 and soldered thereto, such as by passing the aligned connector and board through an infrared oven. Depending on the application of the connector component, side retaining members or fitting nails 11 may also be soldered to the circuit board 102 to increase the strength of the connection between the connector component 2 and the circuit board 102.

When soldering the connector component 2 to a circuit board 102, melted solder and/or solder flux may encompass the lower step, i.e., the area of the solder tail portion 8 between the inner and outer edges 8a & 8b, and follow along the inner edge 8a to the ramped portion 10a thereof. However, due to the offset of the ramped portion 10a, the increased width of the intervening space 10 of the terminal and the depth D of the intervening space 10, the ramped portions 10a and solder tail inner edges 8a are spaced sufficiently apart from the confronting inner edge 7a of the contact portion 7.

This irregular, increased spacing increases the capacity of the solder tail portion 8 to hold the solder and/or solder flux around it to thereby substantially prevent bridging of the molten solder and/or solder flux across the intervening space 10. In addition, the shape of the terminal maximizes the distance solder and/or flux must travel before reaching the contact surface 12 thereof. Thus, contamination of the contact portions 7 of the terminals 1 of the connector component 2 may be effectively prevented, keeping the connector terminal internal contact edges 12 clean and free of surface contamination.

Numerous modifications may be made by those skilled in the art without departing from the true spirit and scope of the invention. For instance, the irregularity of the intervening spaces 10 of the bifurcated portions 7 & 8 of the terminals 1 may be modified. In any case, a similar or equivalent contamination preventing result can be expected as long as the depth and width of the intervening space 10 is sufficiently large.

We claim:

1. An electrical connector comprising a plurality of terminals arranged in a predetermined pitch along the length of the connector, the terminals being mounted in two opposing sets within an insulative housing of the connector, said connector housing having an elongated connector component-receiving slot disposed therein, each terminal of one set of said terminals being blanked and having a body portion, a contact portion extending along said slot for contacting a mating terminal and a solder tail portion extending exteriorly of said connector housing for interconnection to another circuit member, the contact and solder tail portions being interconnected at the body portion, each of said terminals of said one set of terminals having a connector housing engagement portion disposed generally adjacent one end and a bifurcated portion disposed at another end opposite the connector housing engagement portion, the bifurcated end portion including a distinct contact portion and a distinct solder tail portion separated by an intervening cavity, said cavity extending from a front mating face of said connector towards said one end and being at least partially defined by respective opposing, interior surfaces of said contact and solder tail portions, the contact and solder tail portions having respective contact and solder surfaces disposed on exterior surfaces thereof opposite said contact and solder tail portion interior surfaces, thereby increasing the distance which molten solder or solder flux must travel between said solder surface and said contact surface, said cavity extending at least to a rear end of said solder surface of said solder tail portion.

2. The connector as defined in claim 1, wherein the intervening cavity has an asymmetrical configuration along its depth.

3. The connector as defined in claim 2, wherein the width of said intervening cavity between said contact portion and said solder tail portion varies along the depth of said cavity.

4. The connector as defined in claim 1, wherein said solder tail portion is vertically and horizontally offset from said terminal body portion.

5. The connector as defined in claim 4, where said solder tail portion includes a ramped portion intermediate said terminal body portion and said solder tail solder surface, the ramped portion having an inclined surface extending at an angle from said solder tail solder surface, the angle being defined by the resultant of said vertical and horizontal offsets.

6. The connector as defined in claim 1, wherein said contact surface and said solder surface are generally parallel.

7. The connector as defined in claim 1, wherein said contact and solder tail portions of said terminals generally extend in the same direction from said body portion.

8. The connector as defined in claim 7, wherein said contact and solder tail portions extend generally parallel to each other.

9. The connector as defined in claim 1, wherein said front mating face of said connector is positioned at an angle to said circuit member to which said solder tail portions are to be interconnected.

10. An electrical connector component which is resistant to wicking of molten solder and/or solder flux, comprising:
an elongated insulative housing having first and second opposing sidewalls which define a connector component-receiving slot therebetween;
a plurality of first and second electrical terminals respectively disposed along opposite sides of said slot, each first terminal being blanked and including a body portion having means disposed adjacent one end of said first terminal for securing said first terminal in said housing and further having a bifurcated portion disposed at another end of said terminal, opposite said one end;
said bifurcated portion having a pair of spaced apart legs, one leg including a solder tail extending away from said one end and a second of said pair of legs including a contact member extending generally along said first sidewall, said solder tail and contact member being separated from each other by an intervening, asymmetrical space, the intervening space having a non-uniform width extending along its depth which thereby provides an impediment to said molten solder and/or flux from traveling along said solder tail to said contact member during soldering of said connector component to a circuit board;
said solder tail and said contact member including opposing, interior edges which at least partially define said intervening space, and said contact member and solder tail further having exterior edges spaced apart from their respective interior edges, said exterior edge of said contact member defining a contact surface of said terminal for engaging a terminal of a complementary mating connector component and said exterior edge of said solder tail defining a solder surface of said terminal for soldering to a circuit member.

11. The electrical connector component as defined in claim 10, wherein said solder tails and contact members extend generally parallel to said connector component-receiving slot.

12. The electrical connector component as defined in claim 10, wherein each second terminal includes a second body portion, a second solder tail and a second contact member, the second body portion being disposed intermediate said second solder tail and said second contact member, said second body portion having means for securing said second terminal within said housing, said second contact member extending away from said second body portion along said second sidewall and said second solder tail extending away from said second body portion.

13. The electrical connector component as defined in claim 10, wherein said intervening space is defined by opposing, interior edges of said contact member and solder tail.

14. The electrical connector component as defined in claim 13, wherein said opposing, interior edges of said bifurcated portion contact members and solder tails include inclined portions.

15. The electrical connector component as defined in claim 14, wherein said bifurcated portion contact members and solder tails are interconnected at bights of said first terminal body portions.

16. The electrical connector component as defined in claim 15, wherein said opposing, interior edges of said bifurcated portion contact members and solder tails include inclined portions disposed between the first terminal body portion bights and ends of said contact members and solder tails, said inclined portions increasing the surface extent of said bifurcated portion contact member and solder tail interior edges between said bights and the ends of said contact members and solder tails.

17. The electrical connector component as defined in claim 10, wherein said first terminal solder tails are offset from said body portions.

18. An anti-wicking terminal for use in an electrical connector component, the terminal comprising: a body portion, a housing engagement portion for securing said terminal within a connector housing and a bifurcated end portion, the bifurcated end portion including distinct contact and solder tail portions extending away from the body portion and being separated from each other by an intervening gap, the intervening gap being defined in part by opposing interior edges of said contact and solder tail portions, said contact and solder tail portions further having exterior edges spaced apart from their respective interior edges, a portion of said exterior edge of said contact portion defining a contact surface of said terminal for engaging a terminal of a complementary mating connector component and a portion of said exterior edge of said solder tail portion defining a solder surface of said terminal for soldering to a circuit member, the contact and solder surfaces being disposed on opposite sides of said bifurcated end portion, which thereby increases the distance which molten solder and/or flux must travel from said solder surface to said contact surface of said terminal during soldering of said connector component, said gap extending at least to a rear end of said solder surface.

19. The terminal of claim 18, wherein said intervening gap has a depth which extends between said body portion and outer ends of said respective contact and solder tail portions and said contact and solder tail portion interior edges are non-linear along said depth.

20. The terminal of claim 18, wherein said intervening gap is irregular in configuration.

21. The terminal of claim 18, wherein said intervening gap is asymmetrical.

22. The terminal of claim 18, wherein said solder surface is offset vertically and horizontally from said terminal body portion.

23. The terminal of claim 18, wherein said terminal is blanked from sheet metal material.

\* \* \* \* \*